US012751158B2

(12) United States Patent
Ma

(10) Patent No.: US 12,751,158 B2
(45) Date of Patent: Sep. 29, 2026

(54) DISPLAY PANEL AND DISPLAY DEVICE

(71) Applicant: WUHAN TIANMA MICRO-ELECTRONICS CO., LTD., Wuhan (CN)

(72) Inventor: Yufang Ma, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 684 days.

(21) Appl. No.: 18/170,366

(22) Filed: Feb. 16, 2023

(65) Prior Publication Data

US 2023/0200165 A1 Jun. 22, 2023

(30) Foreign Application Priority Data

Sep. 6, 2022 (CN) ......................... 202211096873.8

(51) Int. Cl.
*H10K 59/131* (2023.01)
*H10K 59/80* (2023.01)
*H10K 59/88* (2023.01)

(52) U.S. Cl.
CPC ......... *H10K 59/131* (2023.02); *H10K 59/873* (2023.02); *H10K 59/88* (2023.02)

(58) Field of Classification Search
CPC ..... H10K 59/131; H10K 59/88; H10K 59/873
USPC ............................................................ 257/40
See application file for complete search history.

(56) References Cited

U.S. PATENT DOCUMENTS

2019/0362678 A1* 11/2019 Shin ..................... G09G 3/3266
2020/0144352 A1* 5/2020 Lee ...................... G09G 3/3225
2020/0176526 A1* 6/2020 Yoon .................... H10K 59/131
2020/0176527 A1* 6/2020 An ...................... H10K 59/1216
2021/0125546 A1* 4/2021 Fei ........................... G09G 3/20
(Continued)

FOREIGN PATENT DOCUMENTS

CN 110610667 A 12/2019
CN 112913029 A 6/2021
(Continued)

OTHER PUBLICATIONS

First Office Action (with English translation) received May 22, 2025 for Chinese Application No. 202211096873.8, filed Sep. 6, 2022; 15 pages total.

*Primary Examiner* — Toan Ton

(74) *Attorney, Agent, or Firm* — Christensen O'Connor Johnson Kindness PLLC

(57) ABSTRACT

The present disclosure provides a display panel and a display device. The display panel has a non-display area and a display area surrounding the non-display area, and the non-display area includes a first non-display area and a second non-display area having different areas. The display panel includes type-A signal lines interrupted by the first non-display area and the type-B signal lines interrupted by the second non-display area. A first auxiliary line electrically connects the first type-A signal sub-line and the second type-A signal sub-line disconnected, and a second auxiliary line electrically connects the first type-B signal sub-line and the second type-B signal sub-line disconnected. The first auxiliary line includes a first portion located in the display area, and the second auxiliary line includes a second portion located in the display area. The number of the first auxiliary lines is larger than that of the second auxiliary lines.

19 Claims, 10 Drawing Sheets

(56) References Cited

U.S. PATENT DOCUMENTS

| | | | | |
|---|---|---|---|---|
| 2021/0303040 | A1* | 9/2021 | Choi | G06F 1/1637 |
| 2022/0328576 | A1* | 10/2022 | Huang | G02F 1/1333 |
| 2023/0073626 | A1* | 3/2023 | Du | H10K 59/65 |
| 2023/0200113 | A1* | 6/2023 | Jeong | H10K 59/00<br>257/40 |
| 2023/0200140 | A1* | 6/2023 | Shi | H10K 59/122<br>257/40 |

FOREIGN PATENT DOCUMENTS

| | | | |
|---|---|---|---|
| CN | 113223409 | A | 8/2021 |
| CN | 113471252 | A | 10/2021 |
| CN | 114730541 | A | 7/2022 |

* cited by examiner

DISPLAY PANEL AND DISPLAY DEVICE

CROSS-REFERENCE TO RELATED APPLICATIONS

The present application claims priority to Chinese Patent Application No. 202211096873.8, filed on Sep. 6, 2022, the content of which is incorporated herein by reference in its entirety.

TECHNICAL FIELD

The present disclosure relates to the field of display technology, and more specifically, to a display panel and a display device.

BACKGROUND

At present, in order to improve the user experience of the display panel, an opening is generally provided at a front-facing side of the display panel and configured to arrange a functional component such as a camera, a sensor and the like. In order to achieve normal driving of the pixels near the opening, the wiring of the signal line connected to each pixel needs to be designed. Due to a large number of the functional components, the opening may occupy a large area. In this case, a data line and/or a gate line may be interrupted by the opening; moreover, an area near the opening includes a non-display area surrounding the opening, then a display area of the display panel may be further reduced, resulting in a problem of insufficient space.

SUMMARY

In view of this, the present disclosure provides a display panel and a display device, which can effectively solve the technical problems in the related art and improve the display effect of the display device.

In order to achieve the above object, the present disclosure provides the following technical solutions.

An embodiment of the present disclosure provides a display panel having a non-display area and a display area surrounding the non-display area. The display panel includes: a substrate; signal lines arranged in the display area and including type-A signal lines and type-B signal lines; auxiliary lines including first auxiliary lines and second auxiliary lines. The non-display area includes a first non-display area and a second non-display area that are spaced from each other, and an area of an orthographic projection of the first non-display area onto the substrate is larger than an area of an orthographic projection of the second non-display area onto the substrate. The signal lines each extend in a first direction, one of the type-A signal lines includes a first type-A signal sub-line and a second type-A signal sub-line interrupted by the first non-display area, and one of the type-B signal lines includes a first type-B signal sub-line and a second type-B signal sub-line interrupted by the second non-display area. One of the first auxiliary lines connects the first type-A signal sub-line and the second type-A signal sub-line, and each of at least one first auxiliary line of the first auxiliary lines includes a first portion located in the display area. One of the second auxiliary lines connects the first type-B signal sub-line and the second type-B signal sub-line, and each of at least one second auxiliary line of the second auxiliary lines includes a second portion located in the display area. The number of the first portions is larger than the number of the second portions.

Correspondingly, an embodiment of the present disclosure further provides a display device, including the display panel described above.

It should be noted that the effects of the present disclosure are not limited to the effects described above, and other effects of the present disclosure will be apparent to those skilled in the art from the following description.

BRIEF DESCRIPTION OF DRAWINGS

In order to better illustrate technical solutions in embodiments of the present disclosure or in the related art, the accompanying drawings used in the embodiments and in the related art are briefly introduced as follows. It should be noted that the drawings described as follows are merely part of the embodiments of the present disclosure, and other drawings can also be acquired by those skilled in the art without paying creative efforts.

DESCRIPTION OF EMBODIMENTS

Figure 1:
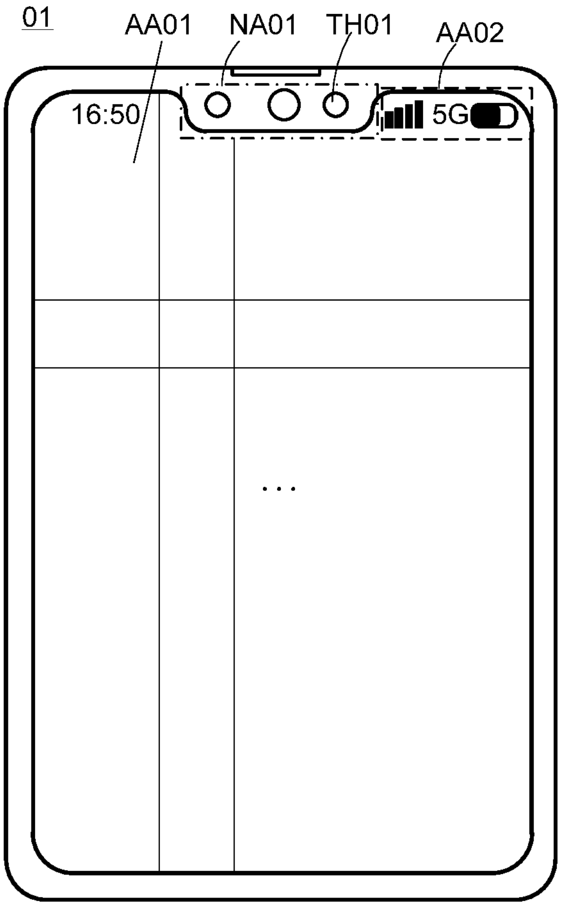
FIG. 1 (Prior Art)
FIG. 1 is a structural schematic diagram of a display panel in the related art.

For better illustrating technical solutions of the present disclosure, embodiments of the present disclosure will be described in detail as follows with reference to the accompanying drawings.

It should be noted that the described embodiments are merely exemplary embodiments of the present disclosure, which should not be interpreted as providing limitations to the present disclosure. All other embodiments obtained by those skilled in the art according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

It should be understood that for purposes of explanation, some specific details are set forth in order to better illustrate embodiments or implementations of the present disclosure. As used herein, "embodiment" and "implementation" are interchangeable as non-limiting examples of devices or methods employing one or more of the inventive concepts disclosed herein. Without departing from the inventive concept, the feature, component, module, layer, film, area and/or aspect of each embodiment (hereinafter individually or collectively referred to as "element"), etc. can be combined, separated, interchanged and/or rearranged.

In general, the use of cross-hatching and/or shading provided in the drawings is intended to clarify the boundary between adjacent elements, such that, unless stated otherwise, neither the presence nor absence of cross-hatching or shading conveys or indicates any preference or requirement in terms of a specific material, property, dimension, proportion of an element, commonality between the elements shown and/or any other characteristic, property, feature, and the like of the element. In addition, in the drawings, the dimension and relative dimension of each element may be exaggerated for clarity and/or descriptive purposes. Furthermore, A same reference numeral denotes a same element.

When one element or layer is described as being "on", "connected to", or "combined to" another one element or layer, the one element or layer may be "directly on", "directly connected to", or "directly combined to" the another one element or layer, or an intermediate element or layer may be provided. The term "connection" may refer to physical connection, electrical connection, and/or fluid connection, with or without an intermediate element.

It should be understood that, although the element may be described using the terms of "first", "second", "third", etc., in the embodiments of the present disclosure, the element will not be limited to these terms. These terms are merely used to distinguish elements from one another. For example, without departing from the scope of the embodiments of the present disclosure, a first area may also be referred to as a second area, similarly, a second area may also be referred to as a first area, etc.

FIG. 1 is a structural schematic diagram of a display panel in the related art. The display panel 01 has a display area AA01 and a function assembly arrangement area NA01. The function assembly arrangement area NA01 is arranged at an upper edge of the display panel 01 and is adjacent to an edge of the display area AA01. That is, the edge of the display area AA01 is recessed toward a center of the display area to form an accommodating space, at which the function assembly arrangement area NA01 is arranged, and the function assembly arrangement area NA01 includes a plurality of through holes TH01 for accommodating the function assembly. It should be understood that the function assembly arrangement area NA01 occupies an area of the display panel, thereby reducing an area of the display area AA01 of the display panel, besides, the function assembly arrangement area NA01 includes a large number of invalid areas, resulting in a waste of the space of the display panel, which is not conducive to achieving a high screen ratio. In addition, the display area AA01 includes a side-edge display area AA02 that is adjacent to the function assembly arrangement area NA01 and is usually configured to display status bar information (such as: time, signal, etc.), due to space constraints, the information that can be displayed is limited, for example, the side-edge display area AA02 has not enough space to display information such as battery percentage value or weather.

In recent years, in addition to the conventional screen display function of the display panel, the requirements for user experience are also getting increased. Usually, multiple function assembly arrangement areas need to be arranged at a front-facing side of the display panel, and the function assembly works by receiving the information transmitted by the function assembly arrangement area, thereby improving the human-computer interaction experience. The function assembly can include a distance/proximity sensor, an ambient light sensor, an infrared sensor, a front-facing camera, a facial recognition device, an earpiece, and the like. Meanwhile, a large screen ratio of the display panel is a development trend in the future market, and the arrangement of the function assembly will bring a great challenge regarding the large screen ratio of the display panel.

Figure 2:
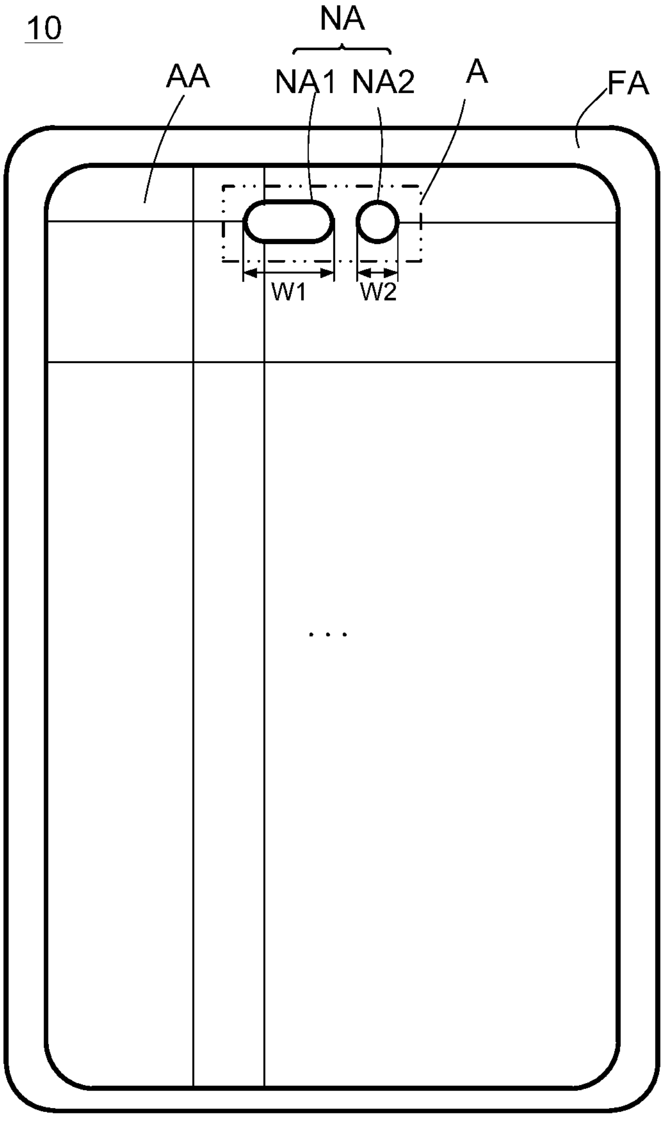
FIG. 2 is a schematic structural diagram of a display panel according to an embodiment of the present disclosure.

The inventor of the present inventive technology has found that, as shown in FIG. 2, if the function assembly arrangement area is surrounded by the display area, it can guarantee the user's function experience and thus making the terminal more intelligent when using the terminal (such as, mobile phone, etc.) for functions other than displaying information, without needing to provide a whole area for arranging the function assembly. In this way, an invalid area between the function assemblies can be reduced, thereby greatly improving the space utilization of the display panel, and improving the screen ratio. Moreover, the available space of the side-edge display area AA02 in the related art can be fully released, and the display area has an enough area to display more information to facilitate users to quickly obtain more information. In addition, an overall appearance of the display panel is more optimized to be more aesthetic, thereby increasing a visual experience of customers during usage.

The inventor of the present disclosure also has found that since the display area surrounds the function assembly arrangement area, signal lines such as a data line and a scan line that have been provided in the display panel may be interrupted by the function assembly arrangement area to affect normal displaying of the display panel; moreover, due to the number of function assemblies, there may be a large number of signal lines disconnected. Therefore, it may be necessary to provide a large panel dead area to arrange the connection signal lines that connect the signal lines interrupted byinterrupted by the function assembly arrangement area. As a result, the display area of the display panel may be reduced.

In order to reduce an area occupied by the function assembly arrangement area, the connection signal lines may be arranged not around the function assembly arrangement area, but be arranged by bypassing to an outer frame area FA surrounding the display area of the display panel. Thus, an electrical connection between the various parts of the signal lines interrupted byinterrupted by the function assembly arrangement area can be achieved in the outer frame area FA. In this case, the outer frame area may be provided with a large number of connection signal lines (for example, dozens or hundreds of signal lines may be interrupted by the function assembly arrangement area). Since the outer frame area of the display panel is usually provided with structures such as a test circuit, a shift register unit, and a power supply voltage signal bus (not shown in the figure), there is a quite limited space for wiring in the metal layers in the outer frame area and in each metal layer, and the addition of a large number of connection signal lines will directly increase a width of the outer frame area of the display panel, resulting in a decrease in the screen ratio of the display panel. If a dimension of the component such as the circuit and the signal bus in the outer frame area is further reduced to reserve space for arranging the connection signal lines, so that an electrical connection between the various parts of the signal lines interrupted by the function assembly arrangement area can be achieved in the outer frame area, then the performance of the circuit and/or the signal bus in the outer frame area will be damaged and the signal transmission capability will be affected. As a result, the display quality may be affected, leading to display unevenness or display abnormality.

Considering the above-mentioned situation, the inventive technology proposes a display panel. Please refer to FIG. 2 and FIG. 3. FIG. 2 is a schematic structural diagram of a display panel 10 according to an embodiment of the present disclosure. The display panel has a non-display area NA and a display area AA, and the non-display area NA includes a first non-display area NA1 and a second non-display area NA2 that are spaced from each other. The display area AA surrounds the non-display area NA, and an area of an orthographic projection of the first non-display area NA1 onto the substrate (not shown in FIG. 2) is larger than an area of an orthographic projection of the second non-display area NA2 onto the substrate. With such a configuration, enough space can be provided for arranging the function assembly, thereby improving the user experience while considering the screen ratio of the display panel and the overall aesthetics. The area of the orthographic projection of the first non-display area NA1 onto the substrate may be 1.5 times, 2 times, 2.5 times, 3 times, 4 times, etc. of the area of the orthographic projection of the second non-display area NA2 onto the substrate.

Figure 3:
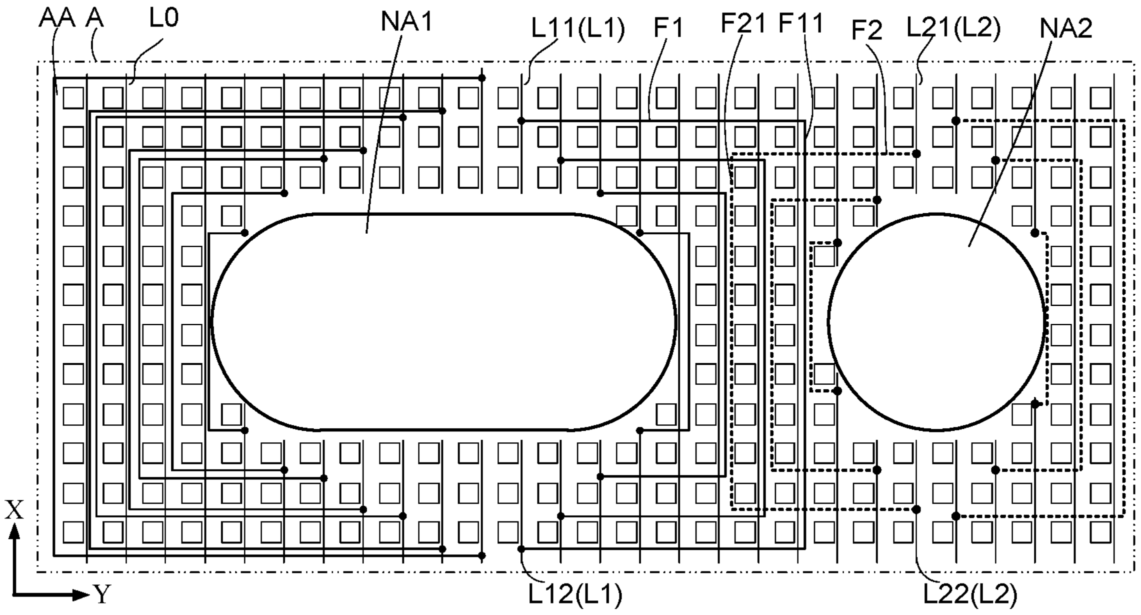
FIG. 3 is a partially enlarged view of an area A shown in FIG. 2 according to another embodiment of the present disclosure.

FIG. 3 is a partially enlarged view of an area A shown in FIG. 2 according to an embodiment of the present disclosure. The signal line includes type-A signal lines L1 and type-B signal lines L2. Due to the first non-display area NA1 and the second non-display area NA2, one type-A signal line L1 is interrupted by the first non-display area NA1 to be a first type-A signal sub-line L11 and a second type-A signal sub-line L12, and one type-B signal line L2 is interrupted by the second non-display area NA2 to be a first type-B signal sub-line L21 and a second type-B signal sub-line L22. It can be understood that a virtual extension line of the type-A signal line L1 passes through the first non-display area NA1, and the type-A signal line L1 includes the first type-A signal sub-line L11 and the second type-A signal sub-line L12 that are spaced from the first non-display area NA1. A virtual extension line of the type-B signal line L2 passes through the second non-display area NA2, and the type-B signal line L2 includes the first type-B signal sub-line L21 and the second type-B signal sub-line L22 that are spaced from the second non-display area NA2. It can be understood that the signal lines each extending along the first direction X may further include a normal signal line L0 that is not interrupted by the non-display area NA, and the normal signal line L0 passes through the display area along the first direction X. In an example, the signal lines can provide signals to the pixels PX arranged in the display panel 10, and in an example, the signal lines may be electrically connected to pads (not shown in the figure) arranged in the outer frame area FA. The signals may include one or more of a power supply voltage signal, a data signal, a reset signal, a bias voltage signal, a gate signal and a light-emitting control signal.

The first type-A signal sub-line L11 and the second type-A signal sub-line L12 interrupted by the first non-display area NA1 are electrically connected in series to each other through a first auxiliary line F1 located therebetween. The first type-B signal sub-line L21 and the second type-B signal sub-line L22 interrupted by the second non-display area NA2 are electrically connected in series to each other through a second auxiliary line F2 connected located therebetween. Each of at least one of the first auxiliary lines F1 includes a first portion F11 arranged in the display area AA. Each of at least one of the second auxiliary line F2 includes a second portion F21 arranged in the display area AA. With such a configuration, a signal of the second type-A signal sub-line L12 can be transmitted to the first type-A signal sub-line L11 through the auxiliary line F1. Each of at least one of the first auxiliary lines F1 is partially arranged in the display area AA, so that an area of the first non-display area NA1 can be reduced (because at least part of the first auxiliary lines F1 is arranged in the display area AA). Similarly, a signal of the second type-B signal sub-line L22 can be transmitted to the first type-B signal sub-line L21 through the auxiliary line F2. Each of at least one of the second auxiliary lines F2 is partially arranged in the display area AA, so that the area of the second non-display area NA2 can be reduced.

It can be understood that, in order to ensure the number of the function assemblies in the display panel while considering the overall aesthetical appearance, the display panel has a first non-display area NA1 and a second non-display area NA2 that have different areas. If the number of the first portions F11 is the same as the number of the second portions F21, the same arrangement of signal lines and auxiliary lines as that at an edge of the second non-display area NA2 can be arranged symmetrically at an edge of the first non-display area NA1, so that a load between the type-A signal line and the type-B signal line extending along the first direction X can be better adjusted. In this way, the design drawings are simpler. However, this may lead to the following result: the first type-A signal sub-line L11 and the second type-A signal sub-line L12 of each of at least some of the type-A signal lines L1 interrupted by the first non-display area NA1 cannot be not be electrically connected to each other through the first portion F11 arranged in the display area, and the first type-A signal sub-line L11 or the second type-A signal sub-line L12 cannot receive the signal of the type-A signal line, thereby directly affecting the display effect of the display panel. If the space in the outer frame area FA is used to arrange the connection line, and the signal of the type-A signal line L1 is transmitted to the first type-A signal sub-line L11 or the second type-A signal sub-line L12, a width of the frame of the display panel will be increased. In this case, the design of the panel is more complicated, and the display area of the display panel is further reduced.

Figure 4:
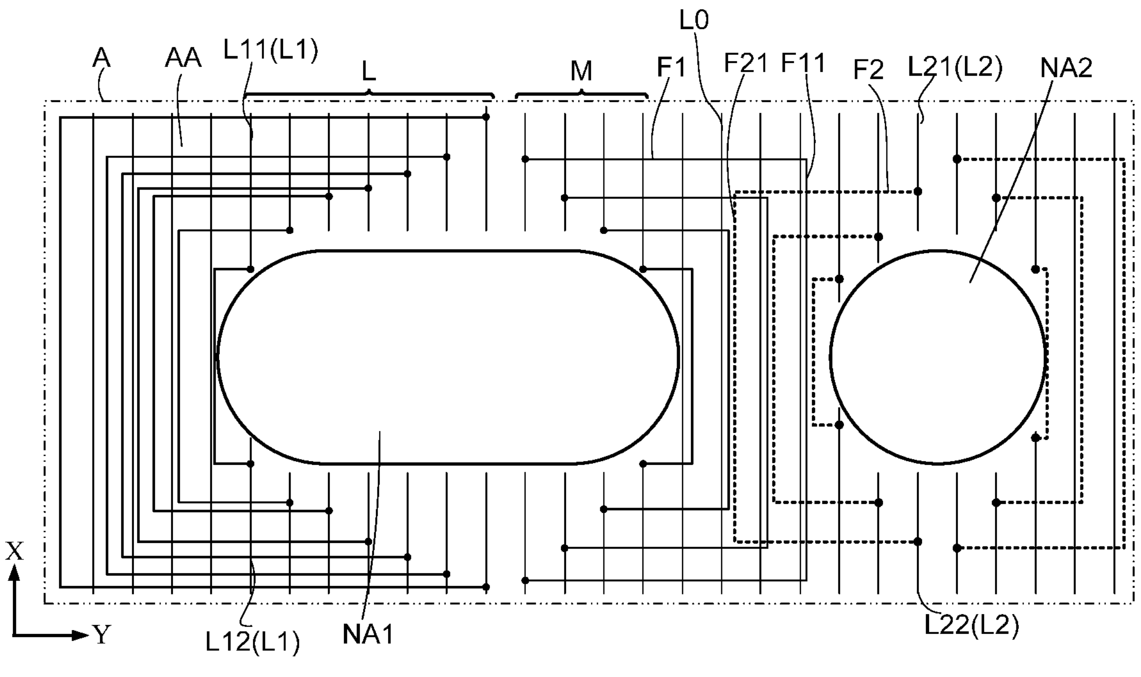
FIG. 4 is another partially enlarged view of an area A shown in FIG. 2 according to another embodiment of the present disclosure.

FIG. 4 is another partially enlarged view of an area A shown in FIG. 2 according to an embodiment of the present disclosure. In some embodiments, as shown in FIG. 4, in order to describe the technical solution more clearly, part of the structure of the display panel is omitted in the figure. Since an area of the first non-display area NA1 is larger than an area of the second non-display area NA2, the number L of the first auxiliary lines F1 arranged at a side of the first non-display area NA1 away from the second non-display area NA2 is set larger, while the number M of the first auxiliary lines F1 arranged at a side of the first non-display area NA1 close to the second non-display area NA2 is set smaller. That is, L is larger than (greater than) sM.

Considering the overall image rendering effect of the display panel, if a distance between the first non-display NA1 and the second non-display area NA2 is too large, the two non-display areas that are far apart may distract the user's attention and affect the user's viewing experience when the display panel is displaying an image. Therefore, the non-display areas in the display panel can be designed to be concentrated as much as possible, and an area of the display area between two non-display areas can be designed relatively small. Considering the factors of space utilization and load balance, the number of the auxiliary lines at two sides of the non-display area NA should tend to be the same, that is, the display area between two non-display areas is provided with the first auxiliary line and the second auxiliary line, but since the area of the display area is small and the space is limited, if L=M, even if the first auxiliary lines F1 and the second auxiliary lines F2 are arranged in different metal layers, it is still unavoidable that the wiring space is small and the crosstalk between lines occurs. The auxiliary line may also generate coupling crosstalk with the conventional signal line L0 in this area, thereby affecting the display effect of the display area.

In an embodiment of the present disclosure, more first auxiliary lines F1 are arranged at a side of the first non-display area NA1 away from the second non-display area NA2, that is, L>M, so that it can be avoided that the display area between the two non-display areas is provided with a large number of auxiliary lines densely arranged and thus there is not enough space to arrange the auxiliary lines. Meanwhile, it can avoid the crosstalk due to an extremely small distance between the lines to affect the display effect of the pixels (not shown in the figure) electrically connected to the type-A signal lines; moreover, the load of the signal line in the display area between the two non-display areas can be adjusted to prevent a large parasitic capacitance difference between the signal lines in this area and the signal lines in other areas of the display panel, thereby avoiding display unevenness of the image.

Figure 5:
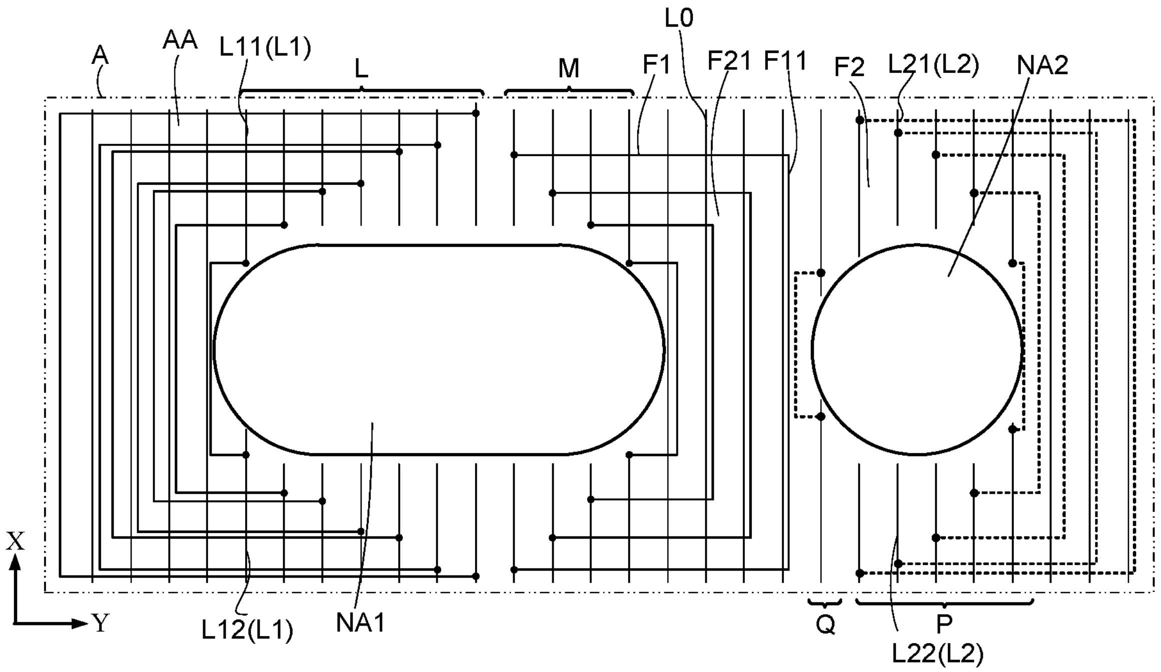
FIG. 5 is another partially enlarged view of an area A shown in FIG. 2 according to another embodiment of the present disclosure.

In an example, in some implementation manners, as shown in FIG. 5, the number P of the second auxiliary lines F2 arranged at a side of the second non-display area NA2 away from the first non-display area NA1 is set larger, while the number Q of the second auxiliary lines F2 arranged at a side of the second non-display area NA2 close to the first non-display area NA1 is set smaller. That is, P is larger than Q.

It should be noted that since the non-display area has a certain length and width, the auxiliary line correspondingly has a certain length in a first direction X and a certain length in the second direction Y, where the second direction intersects the first direction. For example, the first non-display area NA1 and the second non-display area NA2 are arranged along the second direction Y. When a portion of the first auxiliary line F1 is arranged at a side of first non-display area NA1 away from the second non-display area NA2, it can be considered that the first auxiliary line F1 is the first auxiliary line arranged at a side of the first non-display area NA1 away from the second non-display area NA2; and similarly, when a portion of the first auxiliary line F1 is arranged at a side of the second non-display area NA1 close to the second non-display area NA2, it can be considered that the first auxiliary line F1 is the first auxiliary line arranged at a side of the first non-display area NA1 close to the second non-display area NA2. When a portion of the second auxiliary line F2 is arranged at a side of the second non-display area NA2 away from the first non-display area NA1, it can be considered that the second auxiliary line F2 is the second auxiliary line arranged at a side of the second non-display NA2 away from the first non-display area NA1; and similarly, when a portion of the second auxiliary line F2 is arranged at a side of the second non-display area NA2 close to the first non-display area NA1, it can be considered that the second auxiliary line F2 is the is second auxiliary line arranged at a side of the second non-display area NA2 close to the first non-display area NA1.

In an example, in order to balance the load of the signal lines in the display area, in the display area, along the second direction Y, a first portion of only one first auxiliary line is provided between two adjacent conventional signal lines L0.

In an example, in some implementation manners, with further reference to FIG. 2, the first non-display area NA1 and the second non-display area NA2 are sequentially arranged along the second direction. Along the second direction Y, a maximum length of the first non-display area NA1 is W1 and a maximum length of the second non-display area NA2 is W2, and W1>W2. The first direction X is perpendicular to the second direction Y. The first non-display area NA1 can be provided with more function assemblies. Therefore, the length of the first non-display area NA1 is set larger, and the second non-display area NA2 spaced from the first non-display area NA1 is set smaller so that it can be used to arrange a functional assembly that requires high light such, as front camera, thereby avoiding crosstalk to the camera when other functional assemblies are working.

Figure 6:
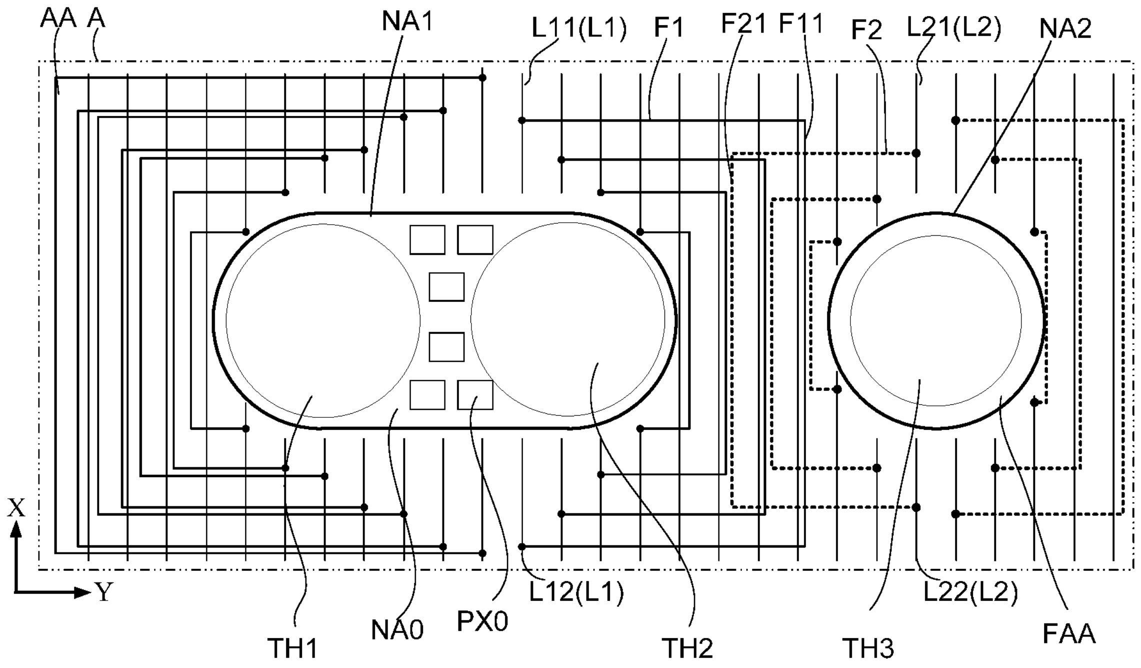
FIG. 6 is another partially enlarged view of an area A shown in FIG. 2 according to another embodiment of the present disclosure.

In an example, in some embodiments, with reference to FIG. 6, the first non-display area NA1 is provided with a first through-hole TH1, a second through-hole TH2 and includes an invalid area NA0 between the two through-holes. The second non-display area is provided with a third through-hole TH3. The invalid area NA0 is provided with a dummy pixel PX0. It can be understood that, the dummy pixel PX0 is a pixel that cannot display light. In an example, the dummy pixel may include a light-emitting device (including a cathode, a light-emitting material layer, and an anode) and a pixel circuit that are not electrically connected to each other. In another example, the dummy pixel may include a pixel circuit and an anode connected to the pixel circuit, without a light-emitting material layer. In another example, the dummy pixel may include any one layer structure in the pixel circuit (such as a semiconductor structure, a gate structure, a source structure, a drain structure, a pixel circuit signal line, etc.).

Figure 7:
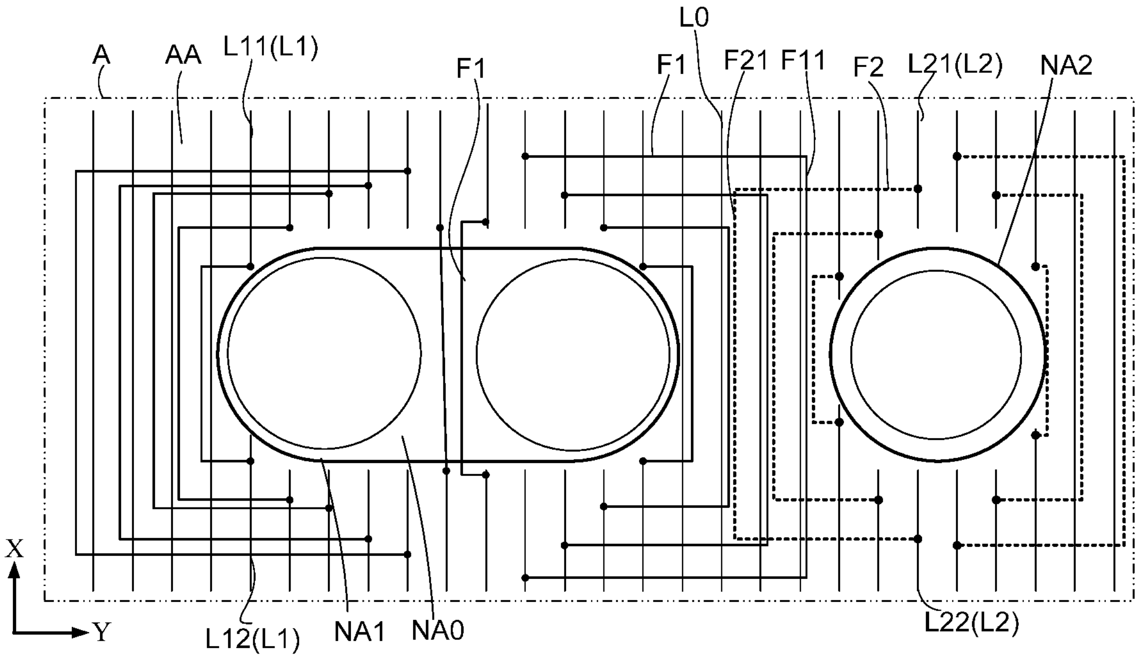
FIG. 7 is another partially enlarged view of an area A shown in FIG. 2 according to another embodiment of the present disclosure.

In an example, with reference to FIG. 7, the invalid area NA0 may be provided with the first auxiliary line. It can be understood that the first auxiliary lines F1 in the display panel have the following two cases: each of some of the first auxiliary lines F1 include a first portion F11 arranged in the display area, and each of some other first auxiliary lines F1 does not include a portion arranged in the display area. It should be noted that since the first non-display area NA1 is provided with the first through-hole TH1 and the second through-hole TH2, considering factors such as crosstalk between function assemblies, an invalid area NA0 may be arranged between the first through-hole TH1 and the second through-hole TH2. The invalid area NA0 may be provided with a part of the first auxiliary lines F1, and the display area AA may be provided with another part of the first auxiliary lines F1. In this way, the invalid area between the first through-hole TH1 and the second through-hole TH2 can be effectively utilized, thereby reducing the wiring difficulty and optimizing the space utilization of the display panel.

In an example, since the invalid area NA0 is not provided with the dummy pixel PX0 that does not emit light, additional first auxiliary lines F1 can be arranged in the invalid area NA0. A partial structure of the dummy pixel arranged in invalid area NA0 is reused as the first auxiliary line F1. In this way, the first auxiliary lines F1 arranged in the invalid area NA0 can be arranged in different metal layers (for example, one or more of a gate metal layer, a source metal layer, a drain metal layer, and a capacitor metal layer that are insulated), thereby fully utilizing an area of the invalid area NA0.

Figure 8:
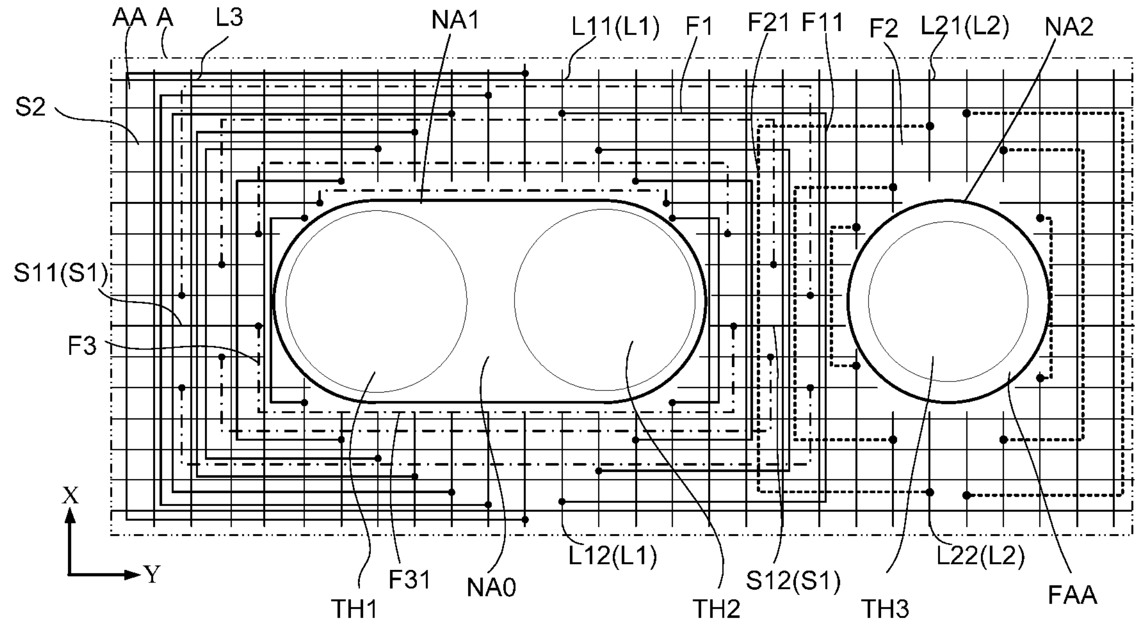
FIG. 8 is another partially enlarged view of an area A shown in FIG. 2 according to another embodiment of the present disclosure.

In an example, in some embodiments of the present disclosure, as shown in FIG. 8, the second non-display area may further include an encapsulation area FAA between the third through-hole TH3 and the display area AA, and at least a part of the second auxiliary lines is arranged in the packaging area FAA. It can be understood that the encapsulation area FAA is provided with at least a part of the substrate, and structures such as blocking walls, partition structures, and anti-crack trenches arranged at the substrate. The encapsulation area FAA can protect the display panel 10 and prevent water and oxygen from extending to the display area AA through the junction of the third through-hole TH3 and the display panel 10, to affect the service life of the display panel.

It can be understood that, since an area of the second non-display area NA2 is smaller than an area of the first non-display area NA1, a part of the second auxiliary lines F2 can be arranged in the encapsulation area FAA rather than in the display area between the first non-display area NA1 and the second non-display area NA2, thereby releasing the wiring space.

In an example, in some embodiments, as shown in FIG. 8, the display area is further provided with a first transmission line S1 extending along the second direction Y, and the first transmission line S1 includes two first transmission sub-lines S11 interrupted by the first non-display area NA1. In an example, the display area AA may be further provided with a second transmission line S2 extending along the second direction Y, and the second transmission line S2 passes through the display area AA, that is, the second transmission line S2 is interrupted by the first non-display area NA1 or the second non-display area NA2. The auxiliary lines include a third auxiliary line F3, and the third auxiliary line F3 connects two first transmission sub-lines S11 that are interrupted by the first non-display area NA1, and each of at least one of the third auxiliary lines F3 includes a third portion F31 arranged in the display area. In an example, the first transmission line S1 and the second transmission line S2 can transmit one or more of a gate control signal, an emission control signal, an initialization signal, a reset signal and a reverse bias voltage signal.

Figure 9:
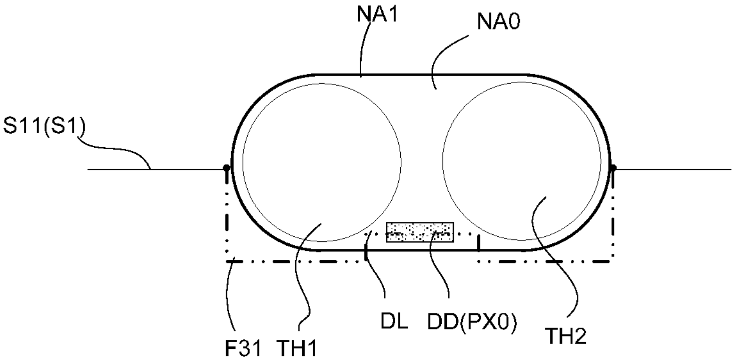
FIG. 9 is a partially enlarged view of a first non-display area NA1 according to the embodiment of the present disclosure.

Further, in some embodiments, with reference to FIG. 9, in order to describe the technical solution more clearly, some structures in the display panel are omitted in FIG. 9, where FIG. 9 is an enlarged view of the first non-display area NA1. The invalid area NA0 is further provided with a first connection structure DL, and the first connection structure is electrically connected to the third auxiliary line. The dummy pixel arranged in the invalid area NA0 includes an electric-conductive structure DD. In a direction perpendicular to a plane of the substrate 100, the electric-conductive structure DD in the dummy pixel PX0 overlaps with the first connection structure. It can be understood that the pixel circuit usually includes a semiconductor layer provided with an active structure, a first metal layer provided with a gate control line, a second metal layer provided with an electrode of a capacitor, and a third metal layer provided with a power supply voltage line or a data line. The electric-conductive structure DD in the dummy pixel PX0 may be arranged in the same layer as any one of the semiconductor layer, the first metal layer, the second metal layer and the third metal layer.

The electric-conductive structure DD is electrically connected to the fixed voltage terminal, and a compensation capacitance can be formed by overlapping the electric-conductive structure DD with the first connection structure DL to balance the load between the first transmission line S1 and the second transmission line S2, thereby avoiding a difference in charging time for the pixels arranged in different rows in the second direction due to the load difference. In this way, an obvious difference between the display area corresponding to the first transmission line S1 and the display area corresponding to the second transmission line S2 in the display area can be avoided, thereby improving the display evenness of the display panel. It can be understood that, since the first non-display area NA1 and/or the second non-display area NA2 occupy a part of the display area AA of the display panel, the number of pixels PX (not shown in FIG. 9) electrically connected to the first transmission line S1 interrupted by the first non-display area NA1 (or second non-display area NA2) will be smaller than the number of pixels PX electrically connected to the second transmission line S2. That is, there is a large difference between the load on the first transmission line S1 and the load on the second transmission line S2. In some embodiments of the present disclosure, by using the compensation capacitance formed between the electric-conductive structure DD and the first connection structure DL in the dummy pixel PX0 in the invalid area NA0, a load difference between the first transmission line S1 and the second transmission line S2 caused by missing pixels can be compensated.

In an example, a line width of the first connection structure is greater than a line width of the first transmission line; or, a line width of the first connection structure is greater than a line width of the portion F31 of the third auxiliary line F3 arranged in the display area. In other words, along the first direction X, a length of the first connection line is greater than a line width of the first transmission line S1. In this way, the first connection line has a larger area, and thus can have a larger overlapping structure with the electric-conductive structure in the dummy pixel, thereby having a larger compensation capacitance. Moreover, there is enough wiring space in the invalid area NA0. Alternatively, along the first direction X, the length of the first connection line is greater than a length of the third portion F31 of the third auxiliary line arranged in the display area AA. The first connection line and the third portion F31 may be formed in a same layer and by a same material, so the manufacturing process is simple, and there is no need to form a through-hole for changing the line in different layers, thereby avoiding a large number of through-holes to occupy the area of the display panel. The first connection line and the third part F31 may also be formed in different metal layers. The present disclosure is not limited to the above example.

Figure 10:
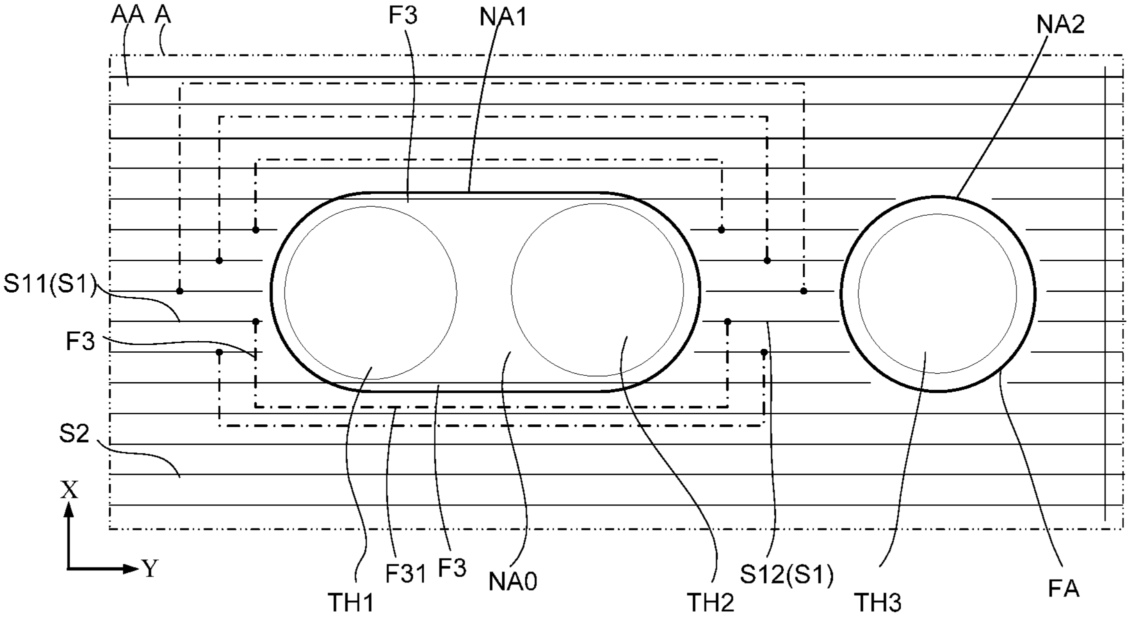
FIG. 10 is another partially enlarged view of an area A shown in FIG. 2 according to another embodiment of the present disclosure.

In an example, with reference to FIG. 10, at least a part of the third auxiliary lines F3 may be arranged in the first non-display area. It can be understood that the display panel may include the third auxiliary line located in the display area AA, or may include the third auxiliary line entirely arranged in the first non-display area NA1, and a part of the invalid area in the first non-display area NA1 can be used to arrange a part of the third auxiliary lines F3.

In an example, in some embodiments, all the third auxiliary lines F3 may be arranged in the non-display area. In this case, the first portion F11 of each of at least a part of the first auxiliary lines F1 and the second portion F21 of each of at least a part of the second auxiliary lines F2 are arranged in the display area.

Figure 11:
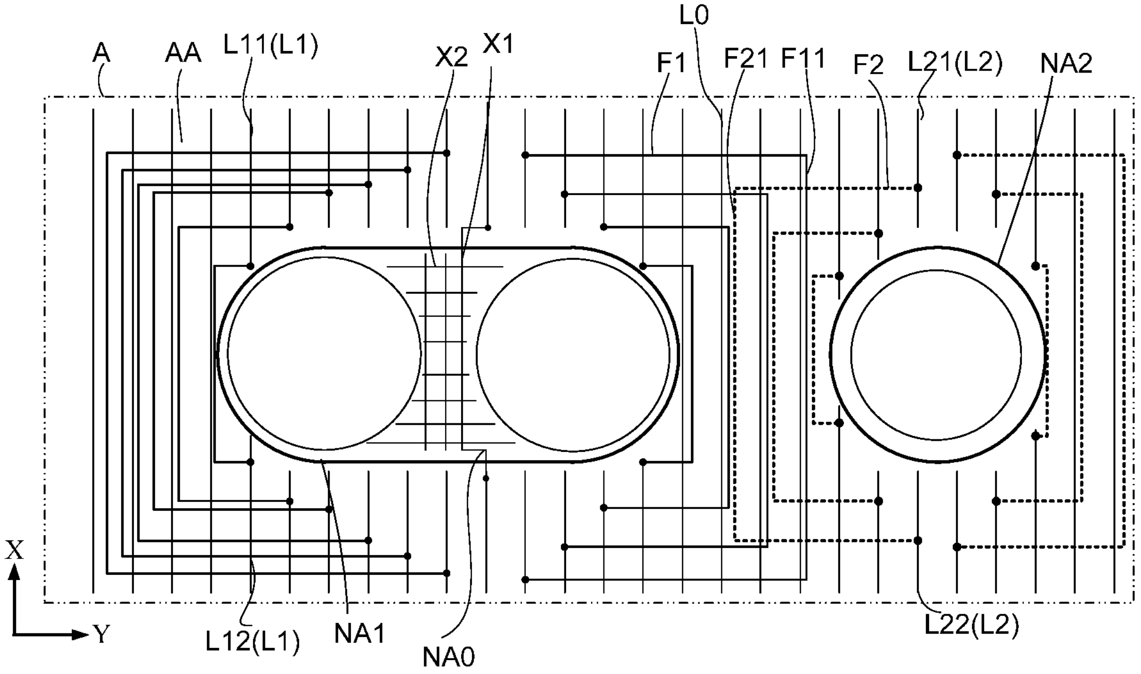
FIG. 11 is another partially enlarged view of an area A shown in FIG. 2 according to another embodiment of the present disclosure.

In an example, with reference to FIG. 11, in some embodiments, the dummy pixel includes a dummy pixel anode (not shown) and a dummy pixel circuit. The dummy pixel circuit includes dummy signal lines X1 each extending along the first direction X and dummy control lines X2 each extending along the second direction Y. That is, in the invalid area NA0, the dummy signal lines and the dummy control lines are arranged in a grid-like shape. The dummy pixel anodes and the dummy pixel circuits are arranged in the invalid area NA0, so that a metal pattern density in the first non-display area is close to a metal pattern density in the display area without changing the pixel arrangement on the substrate, which is beneficial to layout design. The dummy signal line and the dummy control line can also be reused to be electrically connected to the type-A signal line L1 or the first transmission line S1, thereby achieving normal transmission of signals. In other words, since the first non-display area NA1 is provided with two through-holes and includes an invalid area between the two through-holes, the display panel 10 includes not only the type-A signal line interrupted by the first through-hole TH1 or the second through-hole TH2, but also the type-A signal line interrupted by the invalid area. The dummy signal line X2 can also be used to achieve transmission of signals between the first type-A signal sub-line and the second type-A signal sub-line of the type-A signal line interrupted by the invalid area NA0.

Figure 12:
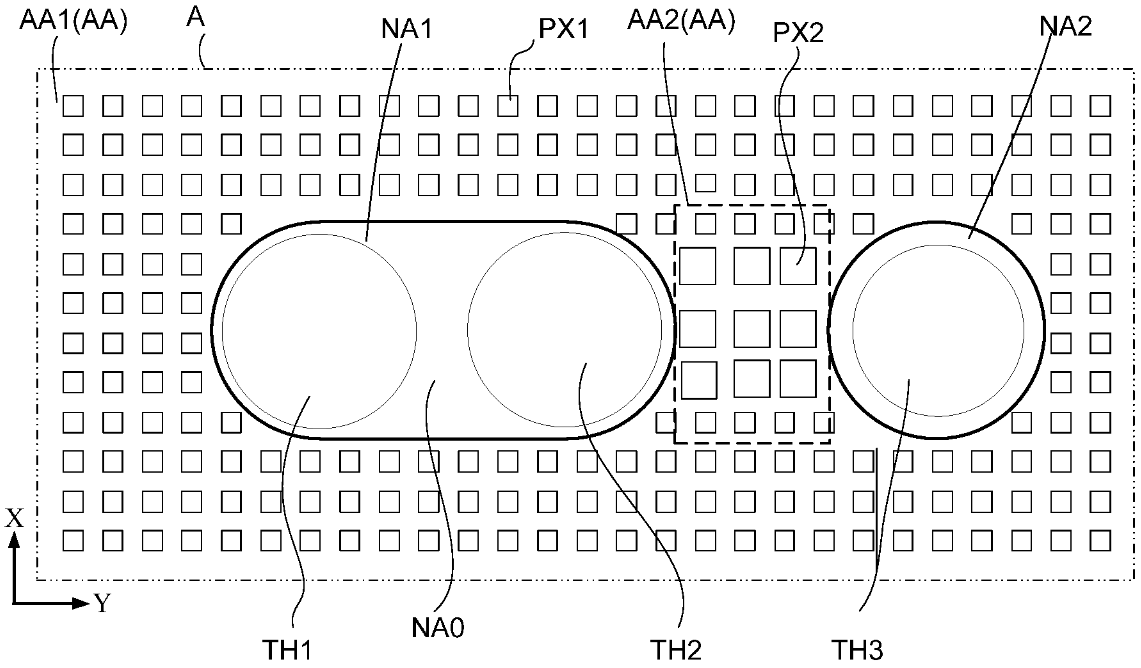
FIG. 12 is another partially enlarged view of an area A shown in FIG. 2 according to another embodiment of the present disclosure.

With reference to FIG. 12, the display panel has a first display area AA1 and a second display area AA2, and the second display area AA2 is located between the first non-display area NA1 and the second non-display area NA2 along the second direction.

In an example, in some embodiments, along the second direction Y, a minimum length of the second display area is the same as a minimum length of the invalid area. With such a configuration, it can ensure that the through-holes have roughly the same space from one another, and the design thereof is simple. It should be noted that the same length referred to in this specification indicates that the lengths within an allowable range of process error are generally the same, and considering the process error, the length difference between the two can be within a range of ±5%.

In an example, in some embodiments, along the second direction Y, a minimum length of the second display area is greater than a minimum length of the invalid area. Reducing the length of the invalid area as much as possible can further increase the screen ratio of the display panel.

In an example, with further reference to FIG. 12, an area of the pixel PX1 in the first display area AA1 is larger than an area of the pixel PX2 in the second display area AA2. In some cases, such as in a screen-off mode or other functional modes, some pixels in the second display area AA2 can be set to be always turned on, so as to serve as a reminder. For example, some privacy reminder signs are displayed. For example, during a voice recording process, some pixels in the second display area AA2 are turned on to display a reminder icon, to remind that it is in a voice recording progress, or when answering a phone call, using a camera or other functions, a corresponding reminder icon can be displayed in the second display area AA2. An area of the second pixel in the second display area AA2 can be set larger to prolong the service life of the pixel in this area, thereby improving the service life of the display panel.

Figure 13:
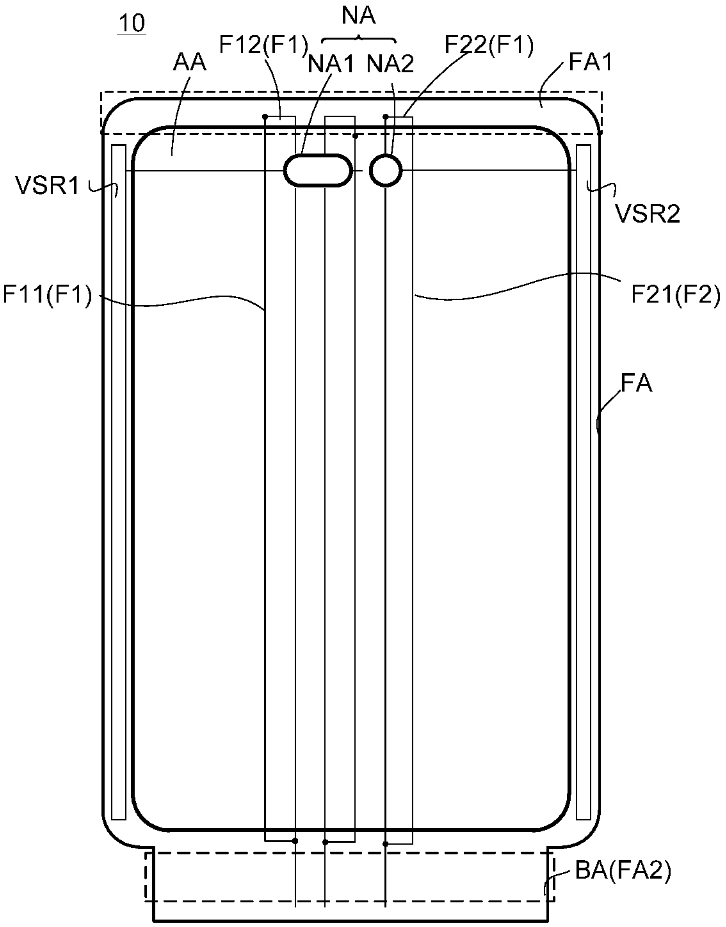
FIG. 13 is a schematic structural diagram of another display panel according to another embodiment of the present disclosure.

In an example, in some embodiments, with reference to FIG. 13, the outer frame area of the display panel may further include an upper frame area FA1 and a lower frame area FA2 located at two opposite sides of the display area AA. The lower frame area includes a bending area BA. The first auxiliary line F1 includes a fourth portion F12 located in the upper frame area. The fourth portion F12 is electrically connected to the first portion F11 to form the first auxiliary line F1, to achieve the electrical connection between the first type-A signal sub-line and the second type-A signal sub-line. The second auxiliary line F2 includes a fifth portion F22 located in the upper frame area. The fifth portion F22 is electrically connected to the second portion F21, to achieve the electrical connection between the first type-B signal sub-line and the second type-B signal sub-line. The upper frame area FA1 is provided with fewer components. By arranging the fourth portion and the fifth portion in the upper frame area, the wiring density in the display area AA can be reduced, meanwhile, the space in the upper frame area can be reasonably utilized, thereby preventing the display panel from having too many invalid dead areas not used for displaying.

Figure 14:
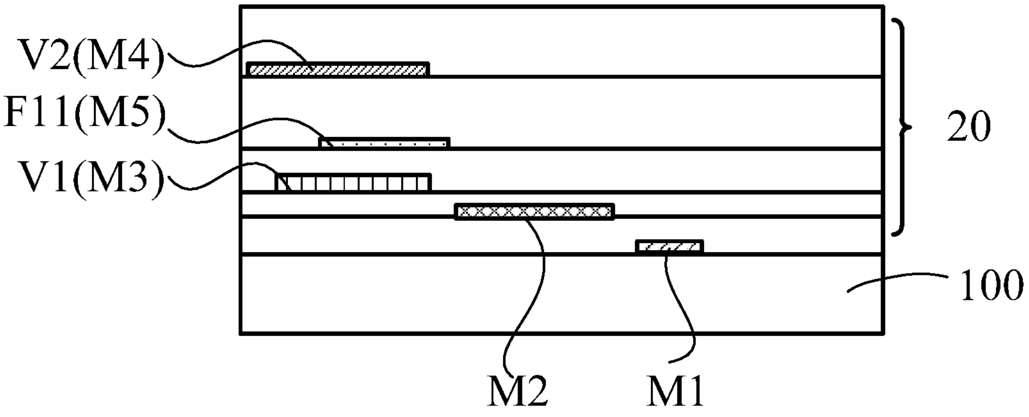
FIG. 14 is a schematic cross-sectional view of a display panel according to an embodiment of the present disclosure.

In an example, as shown in FIG. 14, in the display area AA, the display panel includes a gate metal layer M1, a capacitor metal layer M2, a first metal layer M3 and a second metal layer M4 that are insulated from each other and stacked in sequence. An insulation layer 20 is provided between adjacent metal layers. The gate metal layer M1 may include a gate electrode in the pixel circuit. The capacitor metal layer M2 may include an electrode of a capacitor in the pixel circuit. The first metal layer M3 may include a first voltage signal line V1 in the pixel circuit. The second metal layer M4 may include a second voltage signal line V2 in the pixel circuit. Each of the first voltage signal line and the second voltage signal line may be a positive potential power supply voltage signal line, or a negative potential power supply voltage signal line, or one of a reset voltage signal line, an initialization voltage signal line or a reverse bias voltage signal line. With reference to the schematic diagram of the pixel circuit shown in FIG. 15, each of the positive power supply voltage signal line PVDD, the negative power supply voltage signal line PVEE, the reset voltage signal line ref1, the initialization voltage signal line vref2 and the reverse bias voltage signal line DVH can provide a voltage signal to the corresponding transistor in the pixel circuit, to achieve the normal operation of the pixel circuit. The pixel circuit includes a positive power supply voltage line PVDD electrically connected to a first transistor T1, a data signal line data electrically connected to a second transistor T2, a reset voltage signal line vref1 electrically connected to a fifth transistor T5, an initialization voltage signal line vref2 electrically connected to a seventh transistor T7, a reverse bias voltage signal line DVH electrically connected to an eighth transistor T8, and a driving transistor T3 and a threshold compensation transistor T4 connected in series between the first transistor T1 and the sixth transistor T6. The sixth transistor T6 is connected in series between the driving transistor T3 and the pixel light-emitting device OLED. Another terminal of the light-emitting device OLED is electrically connected to the negative power supply voltage signal line PVEE. Gate electrodes of the first transistor T1 and the sixth transistor T6 are turned on or turned off in response to a signal of a light-emitting control signal line Emit. Gate electrodes of the eighth transistor T8 and the seventh transistor T7 are turned on or turned off in response to a signal of a first gate signal line SP1. A gate electrode of the second transistor T2 is turned on or turned off in response to a signal of a second gate signal line SP2. Gate electrodes of the fourth transistor T4 and the fifth transistor T5 are turned on or turned off in response to signals of a third gate signal line SN1 and a fourth gate signal line SN2, respectively. A gate electrode of the driving transistor T3 is electrically connected to a drain electrode of the fifth transistor. Along the direction perpendicular to the plane of the substrate 100, the first portion F11 is located on the third metal layer M5, the first portion F11 at least partially overlaps with the first voltage signal line V1, and the first portion F11 at least partially overlaps with the second voltage signal line V2. The existing voltage signal line can be used to prevent the signal of the first portion F11 from being interfered by other signal lines.

In an example, in the direction perpendicular to the plane of the substrate 100, the third metal layer M5 may be located between the first metal layer and the second metal layer, and the shielding effect thereof is better.

Figure 15:
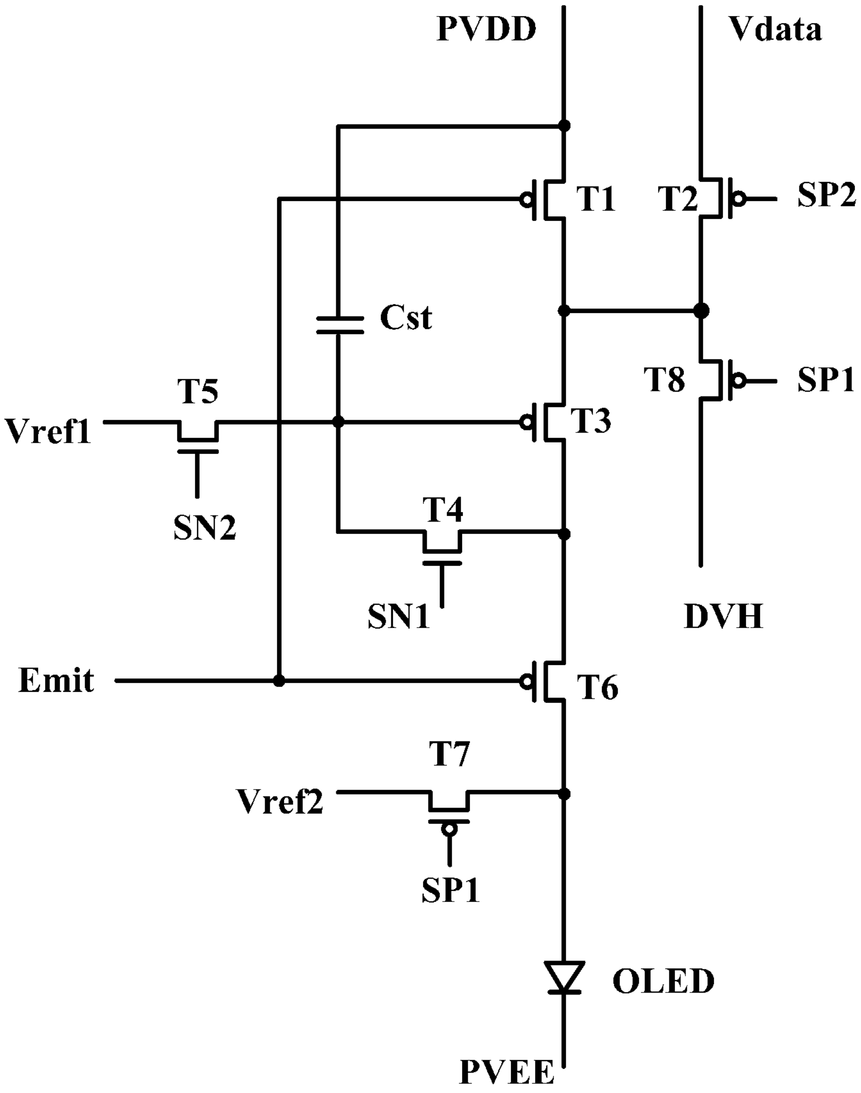
FIG. 15 is a structural diagram of a pixel circuit according to an embodiment of the present disclosure.

In an example, with reference to FIG. 10, FIG. 13 and FIG. 15, in some embodiments, the control signal line (which may include one or more of a light-emitting control signal line Emit, a first gate signal line SP1, a second gate signal line SP2, a third gate signal line SN1, and a fourth gate signal line SN2) is electrically connected to the control terminal of other module in the pixel driving circuit except the data writing module, so that the signal on the control signal line has negligible influence on the data signal in the pixel driving circuit. Therefore, the control signal line can be driven at one side, that is, the control signal line is electrically connected to only one shift register. A part of the control signal lines in the display panel may be electrically connected to the first shift register VSR1, and the remaining part of the control signal lines may be electrically connected to the second shift register VSR2. In this way, it is beneficial to reduce the volume of the first shift register VSR1 and the second shift register VSR2, thereby reducing the size of the outer frame area FA, and further facilitating the realization of a narrow frame.

In addition, the control signal lines corresponding to a same row of pixels can be divided into a first control signal line and a second control signal line, the first control signal line corresponding to the first non-display area is electrically connected to the first shift register VSR1, and the second control signal line corresponding to the second non-display area is electrically connected to the second shift register VSR2. It can be understood that with such a configuration, each of the pixels in the entire display area AA can be connected to the shift register, so that the normal display of the pixels can be realized, and the pixel in the display area between the two non-display areas is controlled by the control signal line corresponding to the first non-display area NA1. With such a configuration, the pixel in this display area can be used to compensate the load of the first control signal line, so that the loads of the first control signal line and the second control signal line tend to be consistent, thereby avoiding the display unevenness of the display area near the two non-display areas.

Figure 16:
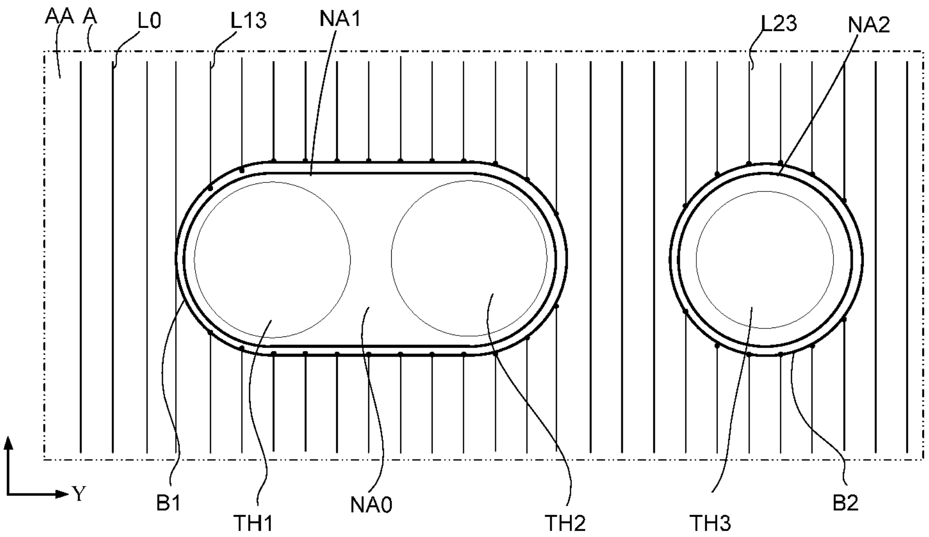
FIG. 16 is another partially enlarged view of an area A shown in FIG. 2 according to another embodiment of the present disclosure.

In an example, with reference to FIG. 16, in order to better described the technical solution, a part of the first type-A signal sub-line, the second type-A signal sub-line, the first type-B signal sub-line, the second type-B signal sub-line and other display panel structure is omitted. The display panel further includes a first closed line B1 surrounding the first non-display area, and/or a second closed line B2 surrounding the second non-display area. The type-A signal lines further include third type-A signal sub-lines L13 that transmit a same signal, and the type-B signal lines further include third type-B signal sub-lines L23 that transmit a same signal. The first closed line B1 connects multiple third type-A signal sub-lines L13. The second closed line B2 connects multiple third type-B signal sub-lines L23. The same signal lines are electrically connected together through a closed line, and a voltage drop of the signal lines is reduced, thereby improving the display effect. In addition, there is no need to provide additional signal connection line for the third type-A signal sub-line or the third type-B signal sub-line, thereby reducing the space occupied by the signal connection line, and thus improving the screen ratio.

Figure 17:
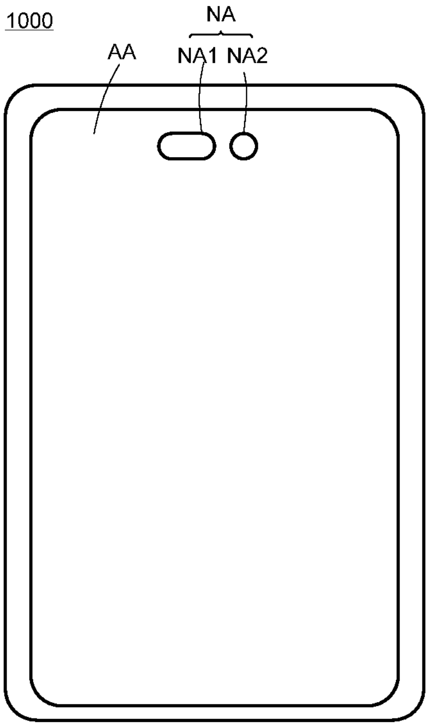
FIG. 17 is a schematic diagram of a display device according to an embodiment of the present disclosure.

With reference to FIG. 17, which is a schematic structural diagram of a display device according to an embodiment of the present disclosure, the display device 1000 provided by the embodiment of the present disclosure may be a mobile terminal device.

In an example, the display device provided by the embodiment of the present disclosure may also be an electronic display device, such as a computer, a wearable display device, or the like, and the present disclosure does not limit thereto.

The embodiments of the present disclosure provide a display panel and a display device. The display panel has a first non-display area and a second non-display area having different areas, which can meet the requirements of other non-display functions of the display panel. The signal lines extending along the first direction include a type-A signal line that is interrupted by the first non-display area and a type-B signal line that is interrupted by the second non-display area. The first auxiliary line electrically connects the type-A signal line that is interrupted by the first non-display area, and the second auxiliary line electrically connects the type-B signal line that is interrupted by the second non-display area, thereby achieving normal transmission of the signal on the signal line that is interrupted by the non-display area, so that the display panel can normally display. Meanwhile, at least a part of the structure of the first auxiliary line and the second auxiliary line is arranged in the display area, so that there is no need to additionally arrange a wider wiring space in the non-display area for connecting the signal line that is interrupted by the non-display area. Therefore, the existing display area of the display panel is more effectively utilized, thereby reducing the area of the non-display area and optimizing the space utilization of the display panel.

The above description of the disclosed embodiments enables those skilled in the art to implement or use the present disclosure. Various modifications can be made by those skilled in the art, and the general principle defined herein may be implemented in other embodiments without departing from the scope of the present disclosure. Therefore, the present disclosure is not limited by the embodiments herein, and has broadest scope consistent with the principles and novel features disclosed herein.

What is claimed is:

1. A display panel having a non-display area and a display area surrounding the non-display area, the display panel comprising:

a substrate;

signal lines arranged in the display area and comprising type-A signal lines and type-B signal lines;

auxiliary lines comprising first auxiliary lines and second auxiliary lines;

wherein the non-display area comprises a first non-display area and a second non-display area that are spaced from each other, and wherein an area of an orthographic projection of the first non-display area onto the substrate is larger than an area of an orthographic projection of the second non-display area onto the substrate, wherein the signal lines each extend in a first direction, one of the type-A signal lines comprises a first type-A signal sub-line and a second type-A signal sub-line interrupted by the first non-display area, and one of the type-B signal lines comprises a first type-B signal sub-line and a second type-B signal sub-line interrupted by the second non-display area, wherein the first type-A signal sub-line and the second type-A signal sub-line are connected by one of the first auxiliary lines, and at least one first auxiliary line of the first auxiliary lines comprises a first portion located in the display area, wherein the first type-B signal sub-line and the second type-B signal sub-line are connected by one of the second auxiliary lines, and at least one second auxiliary line of the second auxiliary lines comprises a second portion located in the display area, wherein a number of the first auxiliary lines in the first portion is larger than a number of the second auxiliary lines in the second portion; and wherein the number of the first auxiliary lines located at a side of the first non-display area away from the second non-display area is L, and the number of the first auxiliary lines located at another side of the first non-display area close to the second non-display area is M, where L>M, and M≥1.

2. The display panel according to claim 1, wherein the number of the second auxiliary lines located at a side of the second non-display area away from the first non-display area is P, and the number of the second auxiliary lines located at another side of the second non-display area close to the first non-display area is Q, where P>Q.

3. The display panel according to claim 1, wherein the first non-display area and the second non-display area are arranged in sequence along a second direction perpendicular to the first direction; and wherein along the second direction, a maximum length W1 of the first non-display area and a maximum length W2 of the second non-display area satisfy W1>W2.

4. The display panel according to claim 3, wherein the first non-display area is provided with a first through-hole and a second through-hole, and comprises an invalid area located between the first through-hole and the second through-hole;

wherein the second non-display area is provided with a third through-hole; and wherein the invalid area is provided with a dummy pixel, and the dummy pixel does not emit light.

5. The display panel according to claim 4, wherein the invalid area is provided with at least one of the first auxiliary lines; and wherein a number of the first auxiliary lines located in the invalid area is larger than a number of the first auxiliary lines located in the display area.

6. The display panel according to claim 5, wherein the second non-display area further comprises an encapsulation area located between the third through-hole and the display area, and the encapsulation area is provided with the at least one of the second auxiliary lines.

7. The display panel according to claim 4, wherein the display area is provided with a first transmission line extending along the second direction;

wherein the first transmission line comprises two first transmission sub-lines interrupted by the first non-display area;

wherein the auxiliary lines comprise at least one third auxiliary line, and the two first transmission sub-lines are connected by one of the at least one third auxiliary line; and wherein the at least one third auxiliary line comprises a third portion located in the display area.

8. The display panel according to claim 7, wherein the invalid area further comprises a first connection structure, and the first connection structure is electrically connected to the third auxiliary line;

wherein the dummy pixel comprises an electric-conductive structure; and wherein, the first connection structure overlaps with the electric-conductive structure in a direction perpendicular to a plane of the substrate, and the electric-conductive structure is electrically connected to a fixed voltage terminal.

9. The display panel according to claim 8, wherein a length of the first connection structure is greater than a length of a third portion of the third auxiliary line along the first direction.

10. The display panel according to claim 4, wherein the dummy pixel comprises a dummy pixel anode and a dummy pixel circuit; and wherein the dummy pixel circuit comprises dummy signal lines extending along the first direction and dummy control lines extending along the second direction; and wherein a dummy signal line is reused as at least one of the first auxiliary lines.

11. The display panel according to claim 4, wherein the display area comprises a first display area and a second display area;

wherein the second display area is located between the first non-display area and the second non-display area along the second direction; and wherein a minimum length of the second display area is equal to a minimum length of the invalid area along the second direction.

12. The display panel according to claim 4, wherein the display area comprises a first display area and a second display area;

wherein the second display area is located between the first non-display area and the second non-display area along the second direction; and wherein a minimum length of the second display area is greater than the minimum length of the invalid area along the second direction.

13. The display panel according to claim 11, wherein the first display area is provided with a first pixel, and the second display area is provided with a second pixel; and wherein an area of the first pixel is larger than an area of the second pixel.

14. The display panel according to claim 1, wherein the display panel has an upper frame area and a lower frame area respectively located at two opposite sides of the display area, and the lower frame area comprises a bending area;

wherein one of the first auxiliary lines comprises a fourth portion located in the upper frame area, and the fourth portion is electrically connected to the first portion; and wherein one of the second auxiliary lines comprises a fifth portion located in the upper frame area, and the fifth portion is electrically connected to the second portion.

15. The display panel according to claim 1, wherein the display area is provided with pixels, and each of the pixels comprises a pixel circuit;

wherein the pixel circuit comprises a first voltage signal line located in a first metal layer and a second voltage signal line located in a second metal layer;

wherein the first portion is located in a third metal layer; and wherein the first portion at least partially overlaps with the first voltage signal line, and the first portion at least partially overlaps with the second voltage signal line along a direction perpendicular to the substrate.

16. The display panel according to claim 15, wherein the first voltage signal line is one of a positive power supply voltage signal line, a negative power supply voltage signal line, an initialization signal line, an anode reset signal line or a reverse bias voltage signal line; and wherein the second voltage signal line is one of the positive power supply voltage signal line, the negative power supply voltage signal line, the initialization signal line, the anode reset signal line or the reverse bias voltage signal line; and wherein the third metal layer is located between the first metal layer and the second metal layer along the direction perpendicular to the substrate.

17. The display panel according to claim 1, wherein the display panel further comprises a first closed line surrounding the first non-display area and a second closed line surrounding the second non-display area;

wherein the type-A signal lines comprise third type-A signal sub-lines with a same signal, and the type-B signal lines comprise third type-B signal sub-lines with a same signal; and wherein the first closed line connects the third type-A signal sub-lines, and the second closed line connects the third type-B signal sub-lines.

18. The display panel according to claim 17, wherein the display area is provided with pixel circuits, and the pixel circuits comprise a first edge pixel circuit adjacent to the first non-display area, and a second edge pixel circuit adjacent to the second non-display area; and wherein the first closed line is electrically connected to the first edge pixel circuit, and the second closed line is electrically connected to the second edge pixel circuit.

19. A display device comprising a display panel having a non-display area and a display area surrounding the non-display area, the display panel comprising:

a substrate;

signal lines arranged in the display area and comprising type-A signal lines and type-B signal lines;

auxiliary lines comprising first auxiliary lines and second auxiliary lines;

wherein the non-display area comprises a first non-display area and a second non-display area that are spaced from each other, and an area of an orthographic projection of the first non-display area onto the substrate is larger than an area of an orthographic projection of the second non-display area onto the substrate, wherein the signal lines each extend in a first direction, one of the type-A signal lines comprises a first type-A signal sub-line and a second type-A signal sub-line interrupted by the first non-display area, and one of the type-B signal lines comprises a first type-B signal sub-line and a second type-B signal sub-line interrupted by the second non-display area, wherein the first type-A signal sub-line and the second type-A signal sub-line are connected by one of the first auxiliary lines, and at least one first auxiliary line of the first auxiliary lines comprises a first portion located in the display area, wherein the first type-B signal sub-line and the second type-B signal sub-line are connected by one of the second auxiliary lines, and at least one second auxiliary line of the second auxiliary lines comprises a second portion located in the display area, wherein a number of the first auxiliary line in the first portion is larger than a number of the second auxiliary lines in the second portion; and wherein the number of the first auxiliary lines located at a side of the first non-display area away from the second non-display area is L, and the number of the first auxiliary lines located at another side of the first non-display area close to the second non-display area is M, where $L>M$, and $M\geq 1$.

* * * * *